United States Patent
Kim et al.

(10) Patent No.: US 10,291,209 B2
(45) Date of Patent: May 14, 2019

(54) SEMICONDUCTOR DEVICE FOR GENERATING MODE SIGNALS INCLUDING INFORMATION ON THE CURRENT CHARACTERISTICS

(71) Applicant: SK hynix Inc., Icheon-si, Gyeonggi-do (KR)

(72) Inventors: Kyung Whan Kim, Seoul (KR); Dong Uk Lee, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/686,921

(22) Filed: Aug. 25, 2017

(65) Prior Publication Data
US 2018/0269858 A1    Sep. 20, 2018

(30) Foreign Application Priority Data
Mar. 20, 2017   (KR) .................. 10-2017-0034873

(51) Int. Cl.
| H03K 3/012 | (2006.01) |
| H03K 5/134 | (2014.01) |
| G01R 31/317 | (2006.01) |
| H03K 5/00 | (2006.01) |
| H03K 5/06 | (2006.01) |

(52) U.S. Cl.
CPC .......... *H03K 3/012* (2013.01); *G01R 31/317* (2013.01); *H03K 5/134* (2014.07); *H03K 5/06* (2013.01); *H03K 2005/00019* (2013.01); *H03K 2005/00195* (2013.01)

(58) Field of Classification Search
CPC ............ H03K 3/01; H03K 3/012; H03K 5/26; H03K 5/134; H03K 21/02; H03K 2005/00045; H03K 2005/00019; H03K 2005/00195
USPC .................................................. 327/261, 281
See application file for complete search history.

(56) References Cited

U.S. PATENT DOCUMENTS

2007/0285293 A1* 12/2007 Lee .................. G11C 5/063
    341/144

* cited by examiner

*Primary Examiner* — John W Poos
(74) *Attorney, Agent, or Firm* — William Park & Associates Ltd.

(57) ABSTRACT

A semiconductor device includes a first mode signal generation circuit suitable for generating a first mode signal in response to a command, the first mode signal being enabled in the case where a first period determined depending on a current characteristic of a first MOS transistor is longer than a second period determined by a first passive element; and a second mode signal generation circuit suitable for generating a second mode signal in response to the command, the second mode signal being enabled in the case where a third period determined by a second passive element is longer than a fourth period determined depending on a current characteristic of a second MOS transistor.

19 Claims, 17 Drawing Sheets

12

SEMICONDUCTOR DEVICE FOR GENERATING MODE SIGNALS INCLUDING INFORMATION ON THE CURRENT CHARACTERISTICS

CROSS-REFERENCE TO RELATED APPLICATION

The present application claims priority under 35 U.S.C. § 119(a) to Korean Patent Application No. 10-2017-0034873 filed on Mar. 20, 2017 in the Korean Intellectual Property Office, which is incorporated herein by reference in its entirety as though fully set forth herein.

BACKGROUND

The present invention relates generally to a semiconductor device, and in particular to a semiconductor device capable of enhanced operating margin and reduced power consumption.

Performance characteristics of MOS transistors based upon device current may be categorized into a typical condition, a slow condition and a fast condition. The typical condition represents transistors which are included in a typical group that falls within a performance characteristic range, based upon device current, which is generally desired by manufacturers in order to satisfy semiconductor device performance requirements. The slow condition represents transistors which are included in a group that has inferior current characteristics (that is, a group that has a lower device current) when compared to the transistors belonging to the typical group. The fast condition represents transistors which are included in a group that has superior current characteristics (that is, a group that has greater device current) when compared to the transistors belonging to the typical group. Such differences operating current characteristics (or performance characteristics) of transistors may be due to process variations, for example. It is known that current characteristics of transistors may be changed by variations in the thickness, width/length, sheet resistance and threshold voltage of each of the gate dielectric layers. For reference, in the present specification, a skew may indicate a change in the characteristic of a transistor due to the influence of process variations or the like.

SUMMARY

Various embodiments are directed toward a semiconductor device which generates mode signals, including information on the current characteristics of MOS transistors on the device.

In an embodiment in accordance with the present invention, a method for determining operating characteristics of a semiconductor device may comprise forming an interconnected network of components on the device, where the components include MOS transistors and passive components, and generating a mode signal as an output of the network, wherein the mode signal provides a direct indication of operating characteristics of the MOS transistors.

In an embodiment, a semiconductor device may include: a first mode signal generation circuit suitable for generating a first mode signal in response to a command, the first mode signal being enabled in the case where a first period determined depending on a current characteristic of a first MOS transistor is longer than a second period determined by a first passive element; and a second mode signal generation circuit suitable for generating a second mode signal in response to the command, the second mode signal being enabled in the case where a third period determined by a second passive element is longer than a fourth period determined depending on a current characteristic of a second MOS transistor.

In an embodiment, a semiconductor device may include: a first period signal generation circuit suitable for generating a first period signal which is enabled for a period from a point in time at which a command is generated to a point in time at which a first period determined depending on a current characteristic of a first MOS transistor passes; a first period signal delay circuit suitable for generating a first delayed period signal by delaying the first period signal by a second period determined by a first passive element; and a first overlapping period detection circuit suitable for generating a first mode signal in response to the first period signal and the first delayed period signal.

In an embodiment, a method for determining operating characteristics of a semiconductor device, the method comprising forming an interconnected network of components on the device, where the components include MOS transistors and passive components and generating a mode signal as an output of the network. The mode signal provides a direct indication of operating characteristics of the MOS transistors.

According to the embodiments, by generating information on the current characteristics of the MOS transistors, circuit performance may be improved, insufficiency of operating margin may be corrected, and current consumption may be reduced.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, embodiments in accordance with the present invention will be explained in more detail with reference to the accompanying drawings. Although the present invention is described with reference to a number of example embodiments thereof, it should be understood that numerous other modifications and variations may be devised by one skilled in the art that will fall within the spirit and scope of the invention.

Figure 1:
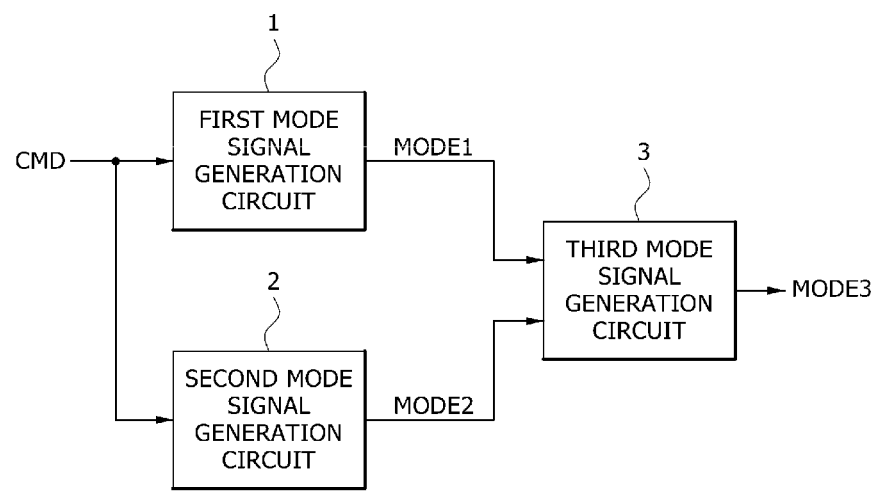
FIG. 1 is a block diagram illustrating the configuration of a semiconductor device in accordance with an embodiment.

As shown in FIG. 1, a semiconductor device in accordance with an embodiment may include a first mode signal generation circuit 1, a second mode signal generation circuit 2, and a third mode signal generation circuit 3.

The first mode signal generation circuit 1 may generate a first mode signal MODE1 in response to a command CMD. The first mode signal generation circuit 1 may generate the first mode signal MODE1 by generating a first period signal PD1 (see FIG. 5) and a first delayed period signal PDd1 (see FIG. 6) from the command CMD. The first period signal PD1 may be enabled for a period from a point in time at which the command CMD is generated, to a point in time when a delay period, determined depending on the current characteristic of MOS transistors, elapses. The first delayed period signal PDd1 may be generated through delaying the first period signal PD1 by a delay period determined by passive elements. The first mode signal generation circuit 1 may generate the first mode signal MODE1, which is enabled from a point in time at which the enable period of the first period signal PD1 and the enable period of the first delayed period signal PDd1 overlap with each other. The enable period of the first period signal PD1 may increase as the current characteristic of the MOS transistors is inferior (i.e., at lower device currents). In the case where the first mode signal MODE1 is enabled, the slow condition of the current characteristic of the MOS transistors is confirmed. In other words, when the MODE1 signal is enabled, that serves as an indication that the MOS transistors on the semiconductor device belong to the group having a lower device current characteristic than the transistors in the typical group.

The second mode signal generation circuit 2 may generate a second mode signal MODE2 in response to the command CMD. The second mode signal generation circuit 2 may generate the second mode signal MODE2 by generating a second period signal PD2 (see FIG. 12) and a second delayed period signal PDd2 (see FIG. 13) from the command CMD. The second period signal PD2 may be enabled for a period determined by passive elements, from a point in time at which the command CMD is generated. The second delayed period signal PDd2 may be generated through delaying the second period signal PD2 by a delay period determined depending on the current characteristic of the MOS transistors on the device. The second mode signal generation circuit 2 may generate the second mode signal MODE2, which is enabled from a point in time at which the enable period of the second period signal PD2, and the enable period of the second delayed period signal PDd2, overlap with each other. The point in time at which the second delayed period signal PDd2 is enabled may be advanced as the current characteristic of the MOS transistors is superior (i.e., the MOS transistors have a higher device current than transistors belonging to the typical group. In the case where the second mode signal MODE2 is enabled, the fast condition of the current characteristic of the MOS transistors is confirmed. In other words, when the MODE2 signal is enabled, that serves as an indication that the MOS transistors on the semiconductor device belong to the group having a higher device current characteristic than the transistors in the typical group.

The third mode signal generation circuit 3 may generate a third mode signal MODE3 in response to the first mode signal MODE1 and the second mode signal MODE2. The third mode signal generation circuit 3 may generate the third mode signal MODE3 in the case where both the first mode signal MODE1 and the second mode signal MODE2 are disabled. In the case where the third mode signal MODE3 is enabled, the typical condition of the current characteristic of the MOS transistors is confirmed. In other words, when the MODE3 signal is enabled, that serves as an indication that the MOS transistors on the semiconductor device belong to the typical group.

Figure 2:
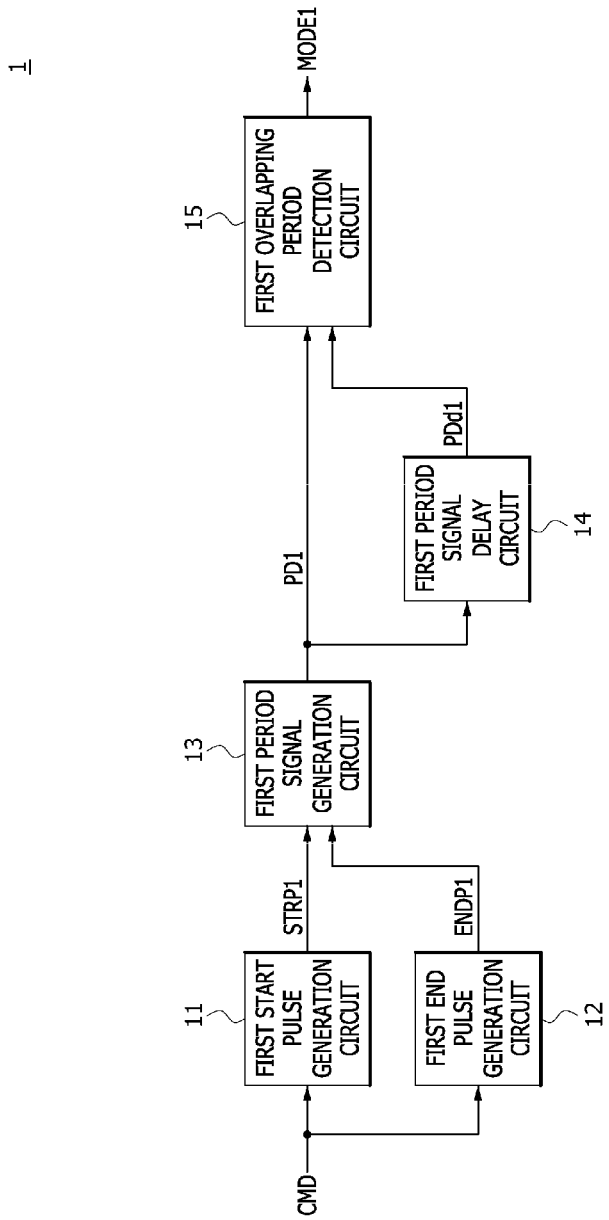
FIG. 2 is a block diagram illustrating the configuration of the first mode signal generation circuit included in the semiconductor device shown in FIG. 1.

Referring to FIG. 2, the first mode signal generation circuit 1 may include a first start pulse generation circuit 11, a first end pulse generation circuit 12, a first period signal generation circuit 13, a first period signal delay circuit 14, and a first overlapping period detection circuit 15.

The first start pulse generation circuit 11 may generate a first start pulse STRP1 in response to the command CMD. The first start pulse generation circuit 11 may generate the first start pulse STRP1 in synchronization with a point in time at which the command CMD is generated.

The first end pulse generation circuit 12 may generate a first end pulse ENDP1 in response to the command CMD. The first end pulse generation circuit 12 may generate the first end pulse ENDP1 by delaying the command CMD through using delay elements which have the current characteristic of MOS transistors on the device. The first end pulse generation circuit 12 may generate the first end pulse ENDP1 at a later point in time, depending on the device current characteristics of the MOS transistors. The lower the device current, the more slowly the MOS transistors will perform, and the later the end pulse ENDP1 will occur.

The first period signal generation circuit 13 may generate the first period signal PD1 in response to the first start pulse STRP1 and the first end pulse ENDP1. The first period signal generation circuit 13 may generate the first period signal PD1, which is enabled in the case where the first start pulse STRP1 is generated. The first period signal generation circuit 13 may generate the first period signal PD1, which is disabled in the case where the first end pulse ENDP1 is generated. The first period signal PD1 may be enabled for a period from a point in time at which the first start pulse STRP1 is generated, to a point in time at which the first end pulse ENDP1 is generated.

The first period signal delay circuit 14 may generate the first delayed period signal PDd1 by delaying the first period signal PD1 by a predetermined delay period. The first period signal delay circuit 14 may include resistors (not shown) and capacitors (not shown), and generate the first delayed period signal PDd1 by delaying the first period signal PD1 by a delay period provided by an RC delay value that is determined by the resistance values of the resistors and the capacitances of the capacitors.

The first overlapping period detection circuit 15 may generate the first mode signal MODE1 in response to the first period signal PD1 and the first delayed period signal PDd1. The first overlapping period detection circuit 15 may generate the first mode signal MODE1, which is enabled from a point in time at which the enable period of the first period signal PD1, and the enable period of the first delayed period signal PDd1, overlap with each other. In the case where the first mode signal MODE1 is enabled, the slow condition of the current characteristic of the MOS transistors is confirmed. In other words, the MODE1 signal is generated when the MOS transistors in the semiconductor device have a lower device current characteristic than MOS transistors of the typical group.

The first mode signal generation circuit 1 may generate the first mode signal MODE1, of which the enable period increases as the device current characteristic of the MOS transistors tends toward an even lower device current. Since the enable period of the first period signal PD1 increases as the current characteristic of the MOS transistors tends toward a lower device current value, the slow condition associated with the lower device current characteristic becomes even more evident, and the enable period of the first mode signal MODE1 may increase.

Figure 3:
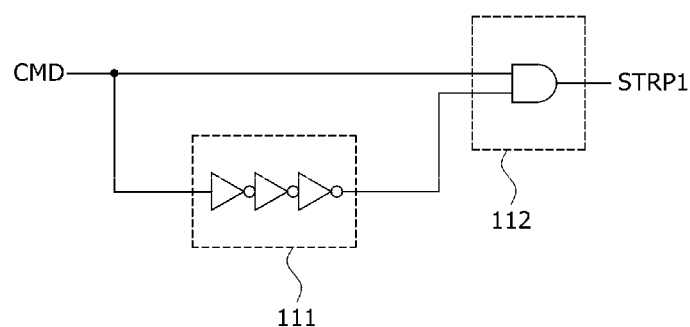
FIG. 3 is a circuit diagram illustrating the first start pulse generation circuit included in the first mode signal generation circuit shown in FIG. 2.

Referring to FIG. 3, the first start pulse generation circuit 11 may include a first command buffer 111 and a first pulse output 112. The first command buffer 111 may invert and delay the command CMD, and output an output signal. The first command buffer 111 may be implemented by an inverter chain which includes an odd number of inverters. The first pulse output 112 may generate the first start pulse STRP1 in response to the command CMD and the output signal of the first command buffer 111. The first pulse output 112 may be generated by providing the command CMD and the output signal of the first command buffer 111 as inputs, and performing an AND logic function. The first start pulse generation circuit 11 may generate the first start pulse STRP1 in synchronization with a point in time at which the command CMD is generated.

Figure 4:
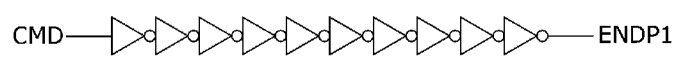
FIG. 4 is a circuit diagram illustrating the first end pulse generation circuit included in the first mode signal generation circuit shown in FIG. 2.

Referring to FIG. 4, the first end pulse generation circuit 12 may generate the first end pulse ENDP1 by delaying the command CMD. The first end pulse generation circuit 12 may be implemented by an inverter chain which includes an even number of inverters. The number of inverters included in the first end pulse generation circuit 12 may be set to be greater than the number of inverters included in the first command buffer 111 illustrated in FIG. 3. Since the inverters included in the first end pulse generation circuit 12 are embodied by MOS transistors, the first end pulse generation circuit 12 may control a point in time at which the first end pulse ENDP1 is generated, depending on the current characteristic of the MOS transistors. The first end pulse generation circuit 12 may generate the first end pulse ENDP1 at a later point in time, reflecting the fact that the current characteristic of the MOS transistors is inferior. As noted above, an inferior current characteristic indicates a lower device current that a typical value, and thus indicates a slower device operating speed.

Figure 5:
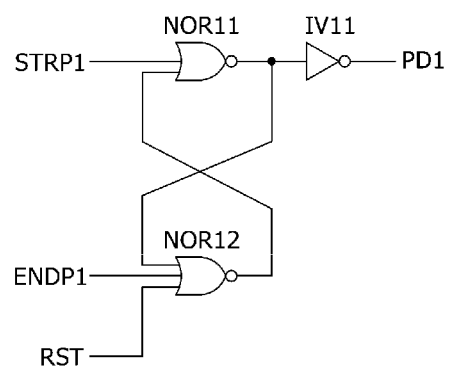
FIG. 5 is a circuit diagram illustrating the first period signal generation circuit included in the first mode signal generation circuit shown in FIG. 2.

Referring to FIG. 5, the first period signal generation circuit 13 may include NOR gates NOR11 and NOR12 and an inverter IV11. The first period signal generation circuit 13 may generate the first period signal PD1, which is enabled to a logic high level, in the case where the first start pulse STRP1 is generated to a logic high level. The first period signal generation circuit 13 may generate the first period signal PD1, which is disabled to a logic low level, in the case where the first end pulse ENDP1 is generated to a logic high level. The first period signal PD1 may be enabled to the logic high level for a period from a point in time at which the first start pulse STRP1 is generated, to a point in time at which the first end pulse ENDP1 is generated.

Figure 6:
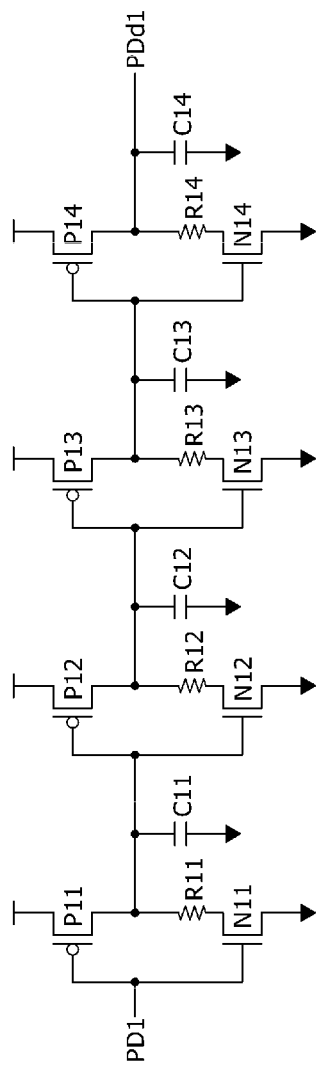
FIG. 6 is a circuit diagram illustrating the first period signal delay circuit included in the first mode signal generation circuit shown in FIG. 2.

Referring to FIG. 6, the first period signal delay circuit 14 may include PMOS transistors P11, P12, P13 and P14, resistors R11, R12, R13 and R14, NMOS transistors N11, N12, N13 and N14 and capacitors C11, C12, C13 and C14. The first period signal delay circuit 14 may generate the first delayed period signal PDd1 by delaying the first period signal PD1 by the predetermined delay period. The delay period of the first period signal delay circuit 14 may be determined depending on an RC delay value set by the resistance values of the resistors R11, R12, R13 and R14 and the capacitances of the capacitors C11, C12, C13 and C14.

Figure 7:
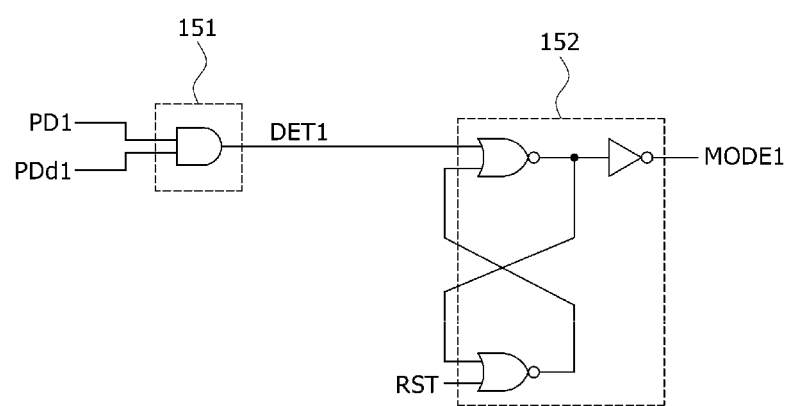
FIG. 7 is a circuit diagram illustrating the first overlapping period detection circuit included in the first mode signal generation circuit shown in FIG. 2.

Referring to FIG. 7, the first overlapping period detection circuit 15 may include a first detection signal generation circuit 151 and a first mode signal output circuit 152.

The first detection signal generation circuit 151 may generate a first detection signal DET1 in response to the first period signal PD1 and the first delayed period signal PDd1. The first detection signal generation circuit 151 may generate the first detection signal DET1 by having as inputs the first period signal PD1 and the first delayed period signal PDd1, and performing an AND logic function. The first detection signal generation circuit 151 may generate the first detection signal DET1 which is enabled to a logic high level, for a period in which both the first period signal PD1 and the first delayed period signal PDd1 are logic high levels.

The first mode signal output circuit 152 may generate the first mode signal MODE1 in response to the first detection signal DET1 and a reset signal RST. The first mode signal output circuit 152 may generate the first mode signal MODE1, which is enabled to a logic high level, in the case where the first detection signal DET1 is enabled to the logic high level. The first mode signal output circuit 152 may generate the first mode signal MODE1, which is disabled to a logic low level, in the case where the reset signal RST, which is enabled to a logic high level is applied. The first mode signal MODE1 may be enabled to the logic high level for a period from a point in time at which the first detection signal DET1 is enabled to the logic high level, to a point in time at which the reset signal RST is enabled to the logic high level. The reset signal RST may be enabled for an initialization operation of the semiconductor device. The reset signal RST may be applied from an exterior of the semiconductor device or be generated inside the semiconductor device.

The first overlapping period detection circuit 15 may generate the first mode signal MODE1, which is enabled from a point in time at which the enable period of the first period signal PD1, and the enable period of the first delayed period signal PDd1, overlap with each other. In the case where the first mode signal MODE1 is enabled, the slow condition of the current characteristic of the MOS transistors is confirmed.

Figure 8:
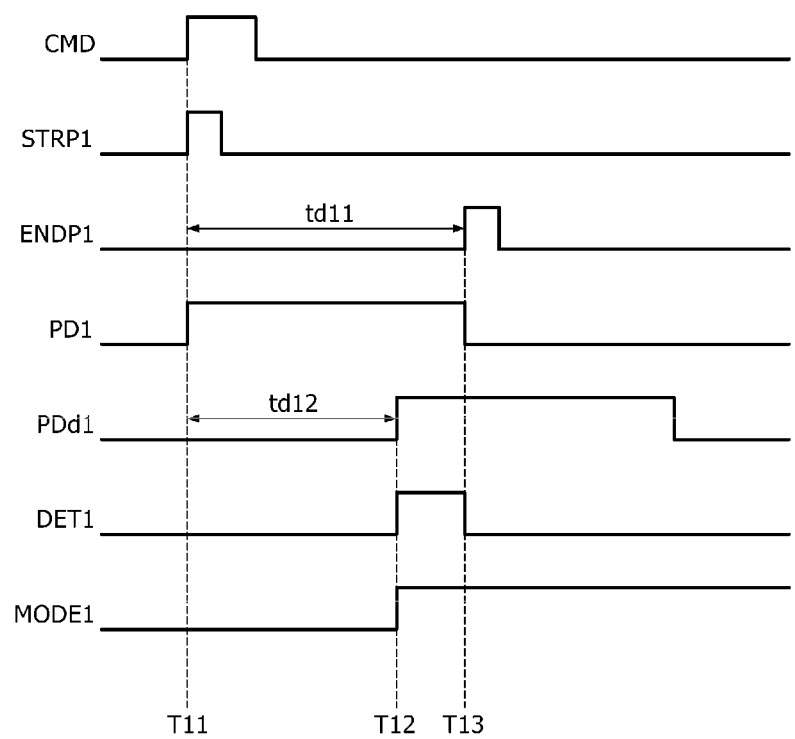
FIG. 8 is a timing diagram that aids in the explanation of the operation of the first mode signal generation circuit shown in FIGS. 2 to 7.

The operation of the first mode signal generation circuit 1, configured as mentioned above, will be described below with reference to FIG. 8.

The first start pulse STRP1 is generated in synchronization with the command CMD which is generated at a point in time T11. According to the first start pulse STRP1 generated at the point in time T11, the first period signal PD1 is enabled to the logic high level.

At a point in time T13, the first end pulse ENDP1 is generated by delaying the command CMD through using the delay elements which have the current characteristic of the MOS transistors. According to the first end pulse ENDP1 generated at the point in time T13, the first period signal PD1 is disabled to the logic low level.

As the first period signal PD1 which is enabled for a period td11 from the point in time T11 to the point in time T13 is delayed by a delay period td12 determined by the RC delay value, the first delayed period signal PDd1 is generated.

The first delayed period signal PDd1 is enabled at a point in time T12 by being delayed by the delay period td12 from the point in time T11 at which the first period signal PD1 is enabled. Therefore, since the first detection signal DET1 is enabled to the logic high level for a period from the point in time T12 to the point in time T13, the first mode signal MODE1 is enabled to the logic high level from the point in time T12.

When the enable period td11 of the first period signal PD1 is longer than the delay period td12 by which the first period signal PD1 is delayed, the first mode signal MODE1 is enabled to the logic high level, and the slow condition of the current characteristic of the MOS transistors is confirmed.

Figure 9:
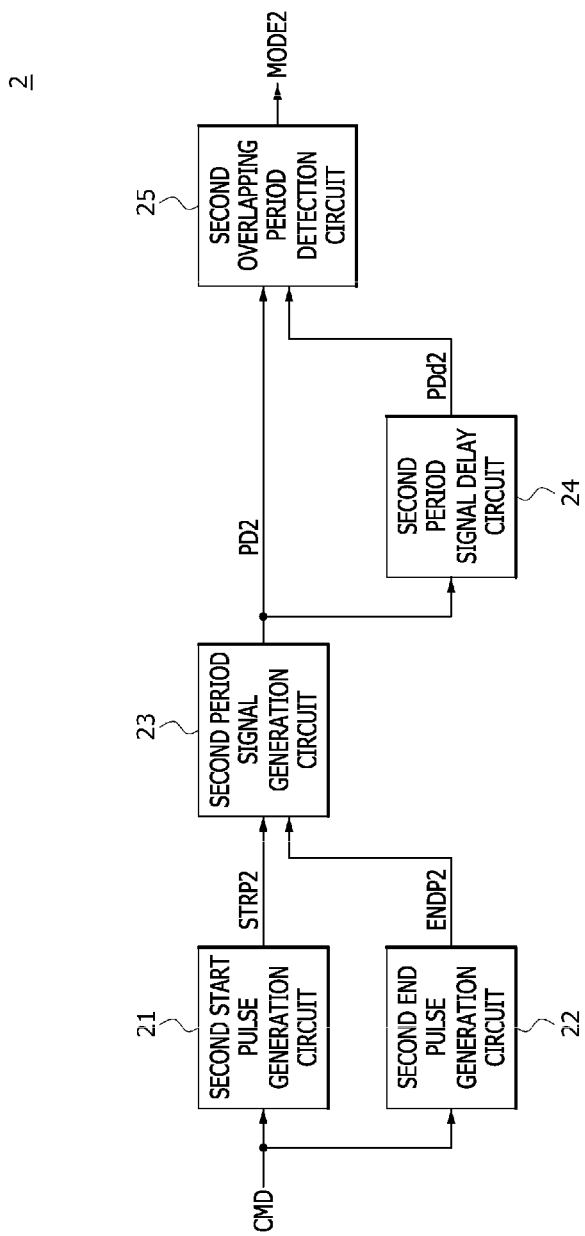
FIG. 9 is a block diagram illustrating the configuration of the second mode signal generation circuit included in the semiconductor device shown in FIG. 1.

Referring to FIG. 9, the second mode signal generation circuit 2 may include a second start pulse generation circuit 21, a second end pulse generation circuit 22, a second period signal generation circuit 23, a second period signal delay circuit 24, and a second overlapping period detection circuit 25.

The second start pulse generation circuit 21 may generate a second start pulse STRP2 in response to the command CMD. The second start pulse generation circuit 21 may generate the second start pulse STRP2 in synchronization with a point in time at which the command CMD is generated.

The second end pulse generation circuit 22 may generate a second end pulse ENDP2 in response to the command CMD. The second end pulse generation circuit 22 may include resistors (not shown) and capacitors (not shown), and generate the second end pulse ENDP2 by delaying the command CMD by a delay period determined by an RC delay value set by the resistance values of the resistors and the capacitances of the capacitors.

The second period signal generation circuit 23 may generate the second period signal PD2 in response to the second start pulse STRP2 and the second end pulse ENDP2. The second period signal generation circuit 23 may generate the second period signal PD2, which is enabled in the case where the second start pulse STRP2 is generated. The second period signal generation circuit 23 may generate the second period signal PD2, which is disabled in the case where the second end pulse ENDP2 is generated. The second period signal PD2 may be enabled for a period from a point in time at which the second start pulse STRP2 is generated to a point in time at which the second end pulse ENDP2 is generated.

The second period signal delay circuit 24 may generate the second delayed period signal PDd2 by delaying the second period signal PD2 by a predetermined delay period. The second period signal delay circuit 24 may generate the second delayed period signal PDd2 by delaying the second period signal PD2 through using delay elements which have the current characteristic of MOS transistors. The second period signal delay circuit 24 may generate the second delayed period signal PDd2, which is enabled at an earlier point of time, since the current characteristic of the MOS transistors is superior.

The second overlapping period detection circuit 25 may generate the second mode signal MODE2 in response to the second period signal PD2 and the second delayed period signal PDd2. The second overlapping period detection circuit 25 may generate the second mode signal MODE2, which is enabled from a point in time at which the enable period of the second period signal PD2, and the enable period of the second delayed period signal PDd2, overlap with each other. In the case where the second mode signal MODE2 is enabled, the fast condition of the current characteristic of the MOS transistors is confirmed.

Figure 10:
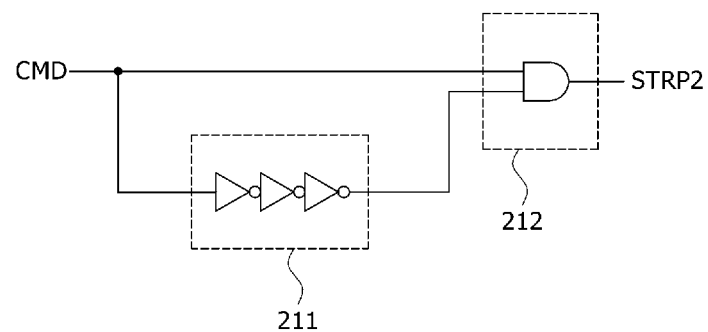
FIG. 10 is a circuit diagram illustrating the second start pulse generation circuit included in the second mode signal generation circuit shown in FIG. 9.

Referring to FIG. 10, the second start pulse generation circuit 21 may include a second command buffer 211 and a second pulse output 212. The second command buffer 211 may invert and delay the command CMD, and output an output signal. The second command buffer 211 may be implemented by an inverter chain which includes an odd number of inverters. The second pulse output 212 may generate the second start pulse STRP2 in response to the command CMD and the output signal of the second command buffer 211. The second pulse output 212 may have as inputs the command CMD and the output signal of the second command buffer 211, and perform an AND logic function. The second start pulse generation circuit 21 may generate the second start pulse STRP2 in synchronization with a point in time at which the command CMD is generated.

Figure 11:
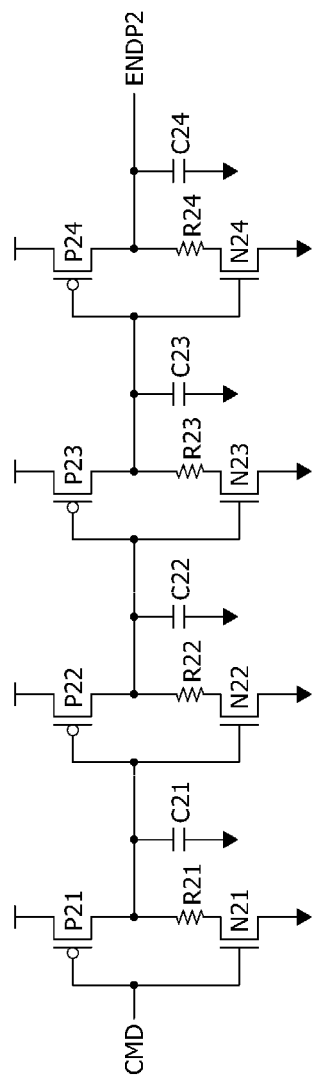
FIG. 11 is a circuit diagram illustrating the second end pulse generation circuit included in the second mode signal generation circuit shown in FIG. 9.

Referring to FIG. 11, the second end pulse generation circuit 22 may include PMOS transistors P21, P22, P23 and P24, resistors R21, R22, R23 and R24, NMOS transistors N21, N22, N23 and N24 and capacitors C21, C22, C23 and C24. The second end pulse generation circuit 22 may generate the second end pulse ENDP2 by delaying the command CMD by the predetermined delay period. The delay period of the second end pulse generation circuit 22 may be determined depending on an RC delay value set by the resistance values of the resistors R21, R22, R23 and R24 and the capacitances of the capacitors C21, C22, C23 and C24.

Figure 12:
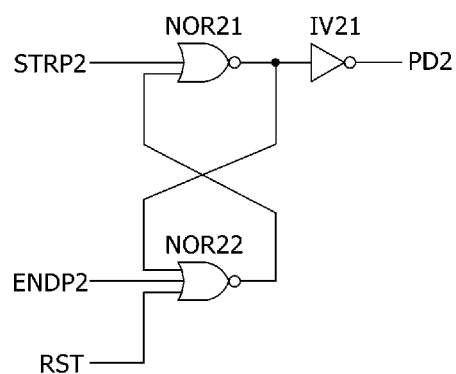
FIG. 12 is a circuit diagram illustrating the second period signal generation circuit included in the second mode signal generation circuit shown in FIG. 9.

Referring to FIG. 12, the second period signal generation circuit 23 may include NOR gates NOR21 and NOR22 and an inverter IV21. The second period signal generation circuit 23 may generate the second period signal PD2, which is enabled to a logic high level in the case where the second start pulse STRP2 is generated to a logic high level. The second period signal generation circuit 23 may generate the second period signal PD2, which is disabled to a logic low level in the case where the second end pulse ENDP2 is generated to a logic high level. The second period signal PD2 may be enabled to the logic high level for a period from a point in time at which the second start pulse STRP2 is generated, to a point in time at which the second end pulse ENDP2 is generated.

Figure 13:
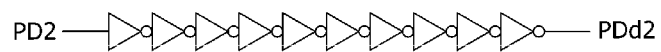
FIG. 13 is a circuit diagram illustrating the second period signal delay circuit included in the second mode signal generation circuit shown in FIG. 9.

Referring to FIG. 13, the second period signal delay circuit 24 may generate the second delayed period signal PDd2 by delaying the second period signal PD2 by the predetermined delay period. The second period signal delay circuit 24 may be implemented by an inverter chain which includes an even number of inverters. The number of inverters included in the second period signal delay circuit 24 may be set to be greater than the number of inverters included in the second command buffer 211 illustrated in FIG. 10. Since the inverters included in the second period signal delay circuit 24 are embodied by MOS transistors, the second period signal delay circuit 24 may control a point in time at which the second delayed period signal PDd2 is enabled, depending on the current characteristic of the MOS transistors. The second period signal delay circuit 24 may generate the second delayed period signal PDd2, which is enabled at an earlier point of time, since the current characteristic of the MOS transistors is superior.

Figure 14:
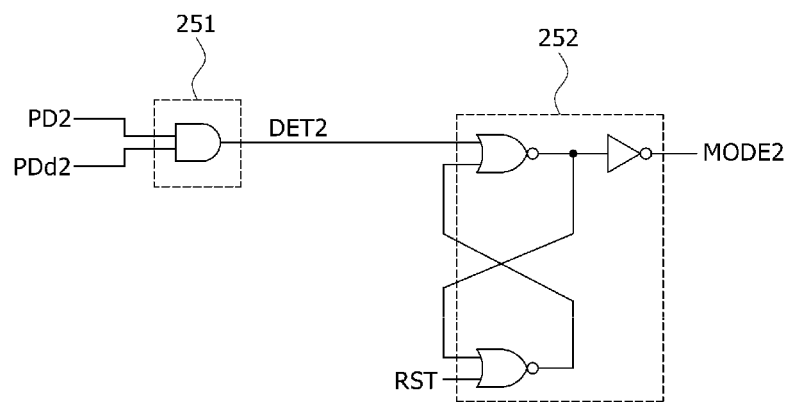
FIG. 14 is a circuit diagram illustrating the second overlapping period detection circuit included in the second mode signal generation circuit shown in FIG. 9.

Referring to FIG. 14, the second overlapping period detection circuit 25 may include a second detection signal generation circuit 251 and a second mode signal output circuit 252.

The second detection signal generation circuit 251 may generate a second detection signal DET2 in response to the second period signal PD2 and the second delayed period signal PDd2. The second detection signal generation circuit 251 may generate the second detection signal DET2 by having as inputs the second period signal PD2, and the second delayed period signal PDd2, and performing an AND logic function. The second detection signal generation circuit 251 may generate the second detection signal DET2, which is enabled to a logic high level, for a period in which both the second period signal PD2, and the second delayed period signal PDd2, are logic high levels.

The second mode signal output circuit 252 may generate the second mode signal MODE2, in response to the second detection signal DET2 and the reset signal RST. The second mode signal output circuit 252 may generate the second mode signal MODE2, which is enabled to a logic high level, in the case where the second detection signal DET2 is enabled to the logic high level. The second mode signal output circuit 252 may generate the second mode signal MODE2, which is disabled to a logic low level, in the case where the reset signal RST, which is enabled to the logic high level, is inputted. The second mode signal MODE2 may be enabled to the logic high level for a period from a point in time at which the second detection signal DET2 is enabled to the logic high level, to a point in time at which the reset signal RST is enabled to the logic high level.

Figure 15:
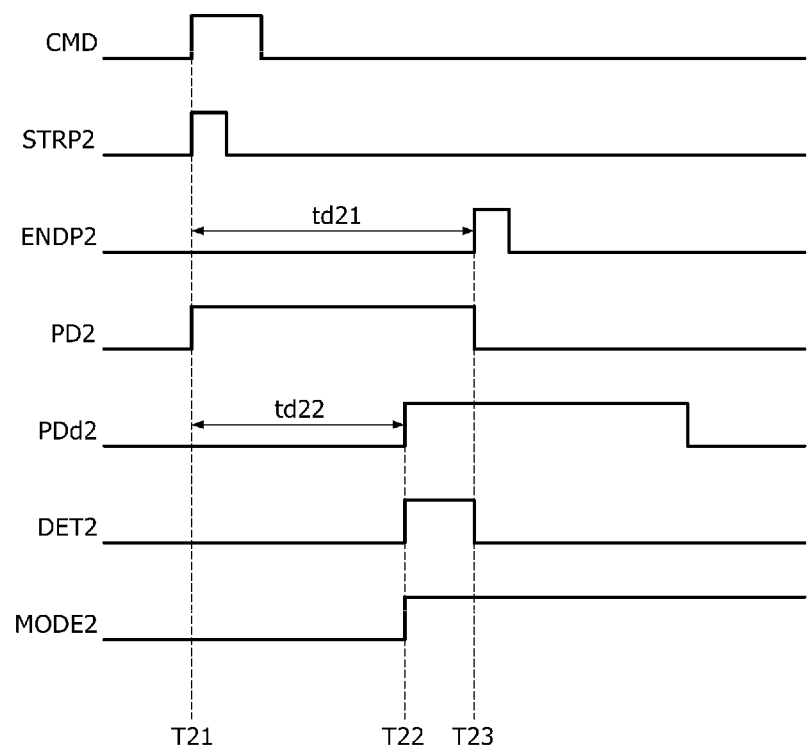
FIG. 15 is a timing diagram that aids in the explanation of the operation of the second mode signal generation circuit shown in FIGS. 9 to 14.

The operation of the second mode signal generation circuit 2, configured as mentioned above, will be described below with reference to FIG. 15.

The second start pulse STRP2 is generated in synchronization with the command CMD, which is generated at a point in time T21. According to the second start pulse STRP2, generated at the point in time T21, the second period signal PD2 is enabled to the logic high level.

At a point in time T23, the second end pulse ENDP2 is generated, as the command CMD is generated by the delay period determined by the RC delay value. According to the second end pulse ENDP2, generated at the point in time T23, the second period signal PD2 is disabled to the logic low level.

As the second period signal PD2, which is enabled for a period td21 from the point in time T21 to the point in time T23, is delayed by the delay elements, which have the current characteristic of the MOS transistors, the second delayed period signal PDd2 is generated.

The second delayed period signal PDd2 is enabled at a point in time T22, by being delayed by a delay period td22 from the point in time T21 at which the second period signal PD2 is enabled. Therefore, since the second detection signal DET2 is enabled to the logic high level for a period from the point in time T22 to the point in time T23, the second mode signal MODE2 is enabled to the logic high level from the point in time T22.

When the delay period td22, by which the second period signal PD2 is delayed, is shorter than the enable period td21 of the second period signal PD2, the second mode signal MODE2 is enabled to the logic high level, and the fast condition of the current characteristic of the MOS transistors is confirmed.

Figure 16:
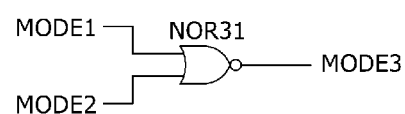
FIG. 16 is a circuit diagram illustrating the third mode signal generation circuit included in the semiconductor device shown in FIG. 1.

Referring to FIG. 16, the third mode signal generation circuit 3 may be implemented by a NOR gate NOR31. The third mode signal generation circuit 3 may have as inputs the first mode signal MODE1 and the second mode signal MODE2, perform a NOR logic function, and generate the third mode signal MODE3. The third mode signal generation circuit 3 may generate the third mode signal MODE3, which is enabled to a logic high level, in the case where both the first mode signal MODE1 and the second mode signal MODE2 are disabled to the logic low levels. In the case where the third mode signal MODE3 is enabled to the logic high level, the typical condition of the current characteristic of MOS transistors is confirmed.

Figure 17:
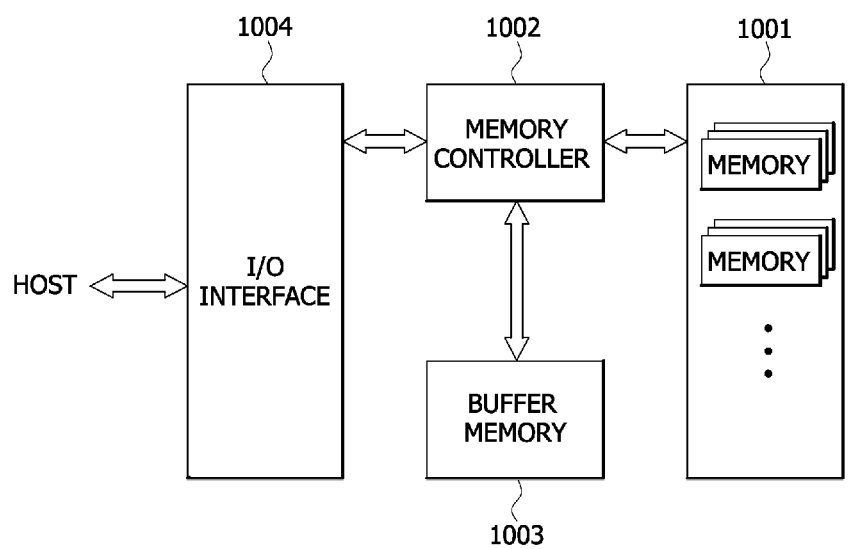
FIG. 17 is a diagram illustrating the configuration of an electronic system to which the semiconductor device illustrated in FIGS. 1 to 16 is applied.

The semiconductor device described above with reference to FIGS. 1 to 16 may be applied to an electronic system which includes a memory system, a graphic system, a computing system or a mobile system. For example, referring to FIG. 17, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device shown in FIG. 1. The data storage 1001 may include a nonvolatile memory capable of not losing and continuously storing data, even though the power supply is interrupted. A nonvolatile memory may be realized as a flash memory, such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 17, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While certain embodiments have been described above, it will be understood by those skilled in the art that the embodiments described are by way of example only. Accordingly, the semiconductor device described herein should not be limited based on the described embodiments. Rather, the semiconductor device described herein should only be limited in light of the claims that follow, when taken in conjunction with the above description and accompanying drawings.

What is claimed is:

1. A semiconductor device comprising:
   a first mode signal generation circuit suitable for generating a first mode signal in response to a command, the first mode signal being enabled in the case where a first period determined depending on a current characteristic of a first MOS transistor is longer than a second period determined by a first passive element; and
   a second mode signal generation circuit suitable for generating a second mode signal in response to the command, the second mode signal being enabled in the case where a third period determined by a second passive element is longer than a fourth period determined depending on a current characteristic of a second MOS transistor,
   wherein the first mode signal is enabled when the current characteristic of the first MOS transistor is a slow condition.

2. The semiconductor device according to claim 1, wherein the first mode signal generation circuit generates a period signal by delaying the command by the first period, and generates a delayed period signal by delaying the period signal by the second period.

3. The semiconductor device according to claim 2, wherein the first mode signal generation circuit generates the first mode signal which is enabled in synchronization with a point of time at which enable periods of the period signal and the delayed period signal overlap with each other.

4. The semiconductor device according to claim 1, wherein the first mode signal generation circuit comprises:
   a period signal generation circuit suitable for generating a period signal which is enabled for a period from a point of time at which the command is generated to a point of time at which the first period passes;
   a period signal delay circuit suitable for generating a delayed period signal by delaying the period signal by the second period; and
   an overlapping period detection circuit suitable for generating the first mode signal in response to the period signal and the delayed period signal.

5. The semiconductor device according to claim 4, wherein the period signal generation circuit generates the period signal in response to a start pulse and an end pulse, and the end pulse is generated by delaying the command through an inverter chain in which the first MOS transistor is included.

6. The semiconductor device according to claim 4, wherein the second period is determined depending on a delay value that is determined by a resistance value of a resistor and a capacitance of a capacitor.

7. The semiconductor device according to claim 1, wherein the second mode signal is enabled when the current characteristic of the second MOS transistor is a fast condition.

8. The semiconductor device according to claim 1, wherein the second mode signal generation circuit generates a period signal by delaying the command by the third period, generates a delayed period signal by delaying the period signal by the fourth period, and generates the second mode signal which is enabled in synchronization with a point of time at which enable periods of the period signal and the delayed period signal overlap with each other.

9. The semiconductor device according to claim 1, wherein the second mode signal generation circuit comprises:
   a period signal generation circuit suitable for generating a period signal which is enabled for a period from a point of time at which the command is generated to a point of time at which the third period passes;
   a period signal delay circuit suitable for generating a delayed period signal by delaying the period signal by the fourth period; and
   an overlapping period detection circuit suitable for generating the second mode signal in response to the period signal and the delayed period signal.

10. The semiconductor device according to claim 9, wherein the third period is determined depending on a delay value that is determined by a resistance value of a resistor and a capacitance of a capacitor.

11. The semiconductor device according to claim 9, wherein the period signal delay circuit generates the delayed period signal by delaying the period signal through an inverter chain in which the second MOS transistor is included.

12. The semiconductor device according to claim 1, further comprising:
    a third mode signal generation circuit suitable for generating a third mode signal which is enabled in the case where both the first mode signal and the second mode signal are disabled.

13. The semiconductor device according to claim 12, wherein the third mode signal is enabled when a current characteristic of a third MOS transistor is a typical condition.

14. A semiconductor device comprising:
    a first period signal generation circuit suitable for generating a first period signal which is enabled for a period from a point of time at which a command is generated to a point of time at which a first period determined depending on a current characteristic of a first MOS transistor passes;

a first period signal delay circuit suitable for generating a first delayed period signal by delaying the first period signal by a second period determined by a first passive element; and a first overlapping period detection circuit suitable for generating a first mode signal in response to the first period signal and the first delayed period signal.

15. The semiconductor device according to claim 14, wherein the first mode signal is enabled when the current characteristic of the first MOS transistor is a slow condition.

16. The semiconductor device according to claim 15, wherein the first period signal generation circuit generates the first period signal in response to a start pulse and an end pulse, and the end pulse is generated by delaying the command through an inverter chain in which the first MOS transistor is included.

17. The semiconductor device according to claim 15, wherein the second period is determined depending on a delay value that is determined by a resistance value of a resistor and a capacitance of a capacitor.

18. The semiconductor device according to claim 15, further comprising:

a second period signal generation circuit suitable for generating a second period signal which is enabled for a period from a point of time at which the command is generated to a point of time at which a third period determined by a second passive element passes;

a second period signal delay circuit suitable for generating a second delayed period signal by delaying the second period signal by a fourth period determined depending on a current characteristic of a second MOS transistor; and a second overlapping period detection circuit suitable for generating a second mode signal in response to the second period signal and the second delayed period signal.

19. The semiconductor device according to claim 18, wherein the second mode signal is enabled when the current characteristic of the second MOS transistor is a fast condition.

* * * * *